United States Patent
Jin et al.

(10) Patent No.: US 9,879,178 B2
(45) Date of Patent: Jan. 30, 2018

(54) FLUORIDE PHOSPHOR, FABRICATING METHOD THEREOF, AND LIGHT-EMITTING APPARATUS AND BACKLIGHT MODULE EMPLOYING THE SAME

(71) Applicant: LEXTAR ELECTRONICS CORPORATION, Hsinchu (TW)

(72) Inventors: Ye Jin, Chongqing (CN); Ru-Shi Liu, New Taipei (TW); Yu-Chun Lee, Hsinchu County (TW); Ching-Yi Chen, New Taipei (TW); Tzong-Liang Tsai, Taichung (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/253,688

(22) Filed: Aug. 31, 2016

(65) Prior Publication Data
US 2017/0137707 A1    May 18, 2017

(30) Foreign Application Priority Data

Nov. 16, 2015   (TW) .............. 104137680 A (51) Int. Cl.
*C09K 11/61* (2006.01)
*H01L 33/50* (2010.01)
(Continued)

(52) U.S. Cl.
CPC .......... *C09K 11/617* (2013.01); *H01L 33/502* (2013.01); *H01L 33/504* (2013.01);
(Continued)

(58) Field of Classification Search
CPC ..... C09K 11/617; H01L 33/504; H01L 33/56; H01L 33/62
See application file for complete search history.

(56) References Cited

U.S. PATENT DOCUMENTS 7,497,973 B2   3/2009 Radkov et al.
8,237,348 B2   8/2012 Masuda et al.
(Continued)

FOREIGN PATENT DOCUMENTS

CN   101705095       5/2010
EP   2508586 A2     10/2012
(Continued)

OTHER PUBLICATIONS

Lv et al., "The Formation Mechanism, Improved Photoluminescence and LED Applications of Red Phosphor K2SiF6:Mn4+," Journal of Materials Chemistry C, Mar. 2014, pp. 3879-3884, vol. 2, The Royal Society of Chemistry, UK.*
(Continued)

*Primary Examiner* — Tom Thomas
*Assistant Examiner* — Benjamin Tzu-Hung Liu (57) ABSTRACT

The present invention provides a method for fabricating a fluoride phosphor. A first solution is formed by dissolving potassium fluoride (KF) and either $K_2MnF_6$ or $KMnO_4$ in a hydrofluoric acid solution. A second solution is formed by mixing a surfactant and a silane. The first solution and the second solution are mixed to form a precipitate. The precipitate is collected after the first solution and the second solution are mixed. The present invention also provides a fluoride phosphor represented by the following formula: $K_2[SiF_6]:Mn^{4+}$. The fluoride phosphor has a particle size in a range of about 1 μm to about 10 μm. The present invention further provides a light-emitting apparatus and backlight module employing the same.

20 Claims, 8 Drawing Sheets

(51) Int. Cl.
 H01L 33/56 (2010.01)
 H01L 33/62 (2010.01)
(52) U.S. Cl.
 CPC ........... H01L 2224/48091 (2013.01); H01L 2224/48247 (2013.01); H01L 2224/48257 (2013.01); H01L 2224/49107 (2013.01); H01L 2224/73265 (2013.01); H01L 2933/0041 (2013.01)

(56) References Cited

U.S. PATENT DOCUMENTS

| | | | |
|---|---|---|---|
| 8,252,613 | B1 | 8/2012 | Lyons et al. |
| 8,362,685 | B2 | 1/2013 | Masuda et al. |
| 8,491,816 | B2 | 7/2013 | Hong et al. |
| 2012/0161170 | A1 | 6/2012 | Dubuc et al. |
| 2015/0053914 | A1* | 2/2015 | Kurtin ............... H01L 33/502 257/13 |
| 2016/0090529 | A1* | 3/2016 | Petry ............... C09K 11/7734 257/98 |
| 2017/0002263 | A1* | 1/2017 | Kaneyoshi ........... C01G 19/006 |

FOREIGN PATENT DOCUMENTS

| | | |
|---|---|---|
| EP | 2663611 A1 | 11/2013 |
| WO | WO 2013088313 A1 | 6/2013 |
| WO | WO 2013121355 A1 | 8/2013 |

OTHER PUBLICATIONS

Jiang et al., "A Red Phosphor BaTiF$_6$:Mn$^{4+}$: Reaction Mechanism, Microstructures, Optical Properties, and Applications for White LED$_s$," Dalton Transactions, Apr. 2014, pp. 9414-9418, vol. 43, The Royal Society of Chemistry, UK.

Zhu et al., "Highly Efficient Non-Rare-Earth Red Emitting Phosphor for Warm White Light-Emitting Diodes," Nature Communications, Jul. 2014, pp. 1-10, Macmillan Publishers Limited, US.

Li et al., "Shape-Controlled Synthesis of Phosphor K$_2$SiF$_6$:Mn$^{4+}$ Nanorods and Their Luminescence Properties," CrystEng Comm, Nov. 2014, pp. 930-936, vol. 17, The Royal Society of Chemistry, UK.

Lv et al., "The Formation Mechanism, Improved Photoluminescence and LED Applications of Red Phosphor K$_2$SiF$_6$:Mn$^{4+}$," Journal of Materials Chemistry C, Mar. 2014, pp. 3879-3884, vol. 2, The Royal Society of Chemistry, UK.

Jiang et al., "Hydrothermal Synthesis and Photoluminescence Properties of Red Phosphor BaSiF$_6$:Mn$^{4+}$ for LED Applications ," Journal of Materials Chemistry C, Jan. 2014, pp. 2301-2306, vol. 2, The Royal Society of Chemistry, UK.

Adachi et al., "Synthesis and Properties of Hetero-Dialkaline Hexafluorosilicate Red Phosphor KNaSiF$_6$:Mn$^{4+}$," Journal of The Electrochemical Society, Dec. 2011, pp. J34-J37, vol. 159, The Electrochemical Society, US.

Kasa et al., "Red and Deep Red Emissions from Cubic K$_2$SiF$_6$:Mn$^{4+}$ and Hexagonal K$_2$MnF$_6$ Synthesized in HF/KMnO$_4$/KHF$_2$/Si Solutions," Journal of the Electrochemical Society, Jan. 2012, pp. J89-J95, vol. 159, The Electrochemical Society, US.

Adachi et al., "Photoluminescent Properties of K$_2$GeF$_6$:Mn$^{4+}$ Red Phosphor Synthesized from Aqueous HF/KMnO$_4$ Solution", Journal of Applied Physics, Jul. 2009, pp. 013516-013516-6, vol. 106, Issue 1, American Institute of Physics, US.

Takahashi et al. "Mn$^{4+}$-Activated Red Photoluminescence in K$_2$SiF$_6$ Phosphor," Journal of The Electrochemical Society, Oct. 2008, pp. E183-E188, vol. 155, The Electrochemical Society, US.

\* cited by examiner

FLUORIDE PHOSPHOR, FABRICATING METHOD THEREOF, AND LIGHT-EMITTING APPARATUS AND BACKLIGHT MODULE EMPLOYING THE SAME

CROSS REFERENCE TO RELATED APPLICATIONS

This application is based on, and claims priority from, Taiwan (International) Application Serial Number 104137680, filed on Nov. 16, 2015, the disclosure of which is hereby incorporated by reference herein in its entirety.

BACKGROUND OF THE INVENTION

Field of the Invention

The present invention relates to a fluoride phosphor, a fabricating method thereof, and a light-emitting apparatus and a backlight module employing the same, and in particular it relates to a fluoride phosphor whose particle size is controllable and is capable of increasing the color rendering index, a fabricating method thereof, and a light-emitting apparatus and a backlight module employing the same.

Description of the Related Art

In recent years, energy-saving and environmental-protection concepts have been a major concern. As new lighting sources, light-emitting diodes (LEDs) can solve the problems that cannot be conquered by traditional incandescent lamps or fluorescent lamps. Also, LEDs meet the requirements of low power consumption and environmental protection. Therefore, issues such as exploiting new energies and increasing energy efficiency have attracted the public's attention. Color LEDs have been used widely in colored lighting, displays, entertainment, and so on. The development of the electronic display industry has been the most rapid. It is believed that LEDs will play an important role in photoelectric element applications in the future.

So far, the development of white light-emitting diodes (WLEDs) is the main developmental direction of LEDs globally. WLEDs have advantages such as small size, low heat radiation, long life, low power consumption, and vibration resistance. WLEDs solve the problems that cannot be conquered by traditional lamps. As traditional energy-consuming and polluting incandescent lamps have been eliminated or prohibited around the world, such as in the European Union, Australia, and America, the uses of LEDs have developed from functional uses such as street lighting, traffic signals, or special household electrical appliances to general use such as household lighting, large displays, automotive lighting, indoor lighting, or the backlight modules of electronic products. As a result, the market penetration rate of LEDs continuously increases at a rate of 10-15% every year. The result further reveals the developmental value of WLEDs in the field of lighting for a new generation.

One of the most common WLEDs used in the industry include blue LED chips accompanied by YAG phosphor ($Y_3Al_5O_{12}$:Ce; Yttrium aluminum garnet). However, in order to remedy the red light spectrum which YAG phosphor ($Y_3Al_5O_{12}$:Ce; Yttrium aluminum garnet) lacks, the process for the red light-emitting phosphor-added WLEDs has become a new issue. So far, there is lots of information about the synthesis and applications of the red light-emitting phosphor. For example, it is known that $A_2[MF_6]$:$Mn^{4+}$ (wherein A is Li, Na, K, Rb, Cs, $NH_4$; and M is Ge, Si, Sn, Ti, Zr) fluorides may serve as a red light-emitting phosphor for LEDs. In addition, Adachi et al. (Japan) have also synthesized $K_2[SiF_6]$:$Mn^{4+}$ and tried to improve its synthesis condition, luminous efficiency, and heat resistance.

Different particle sizes of phosphors are needed depending on the different requirements of processes. For example, the phosphor generally used in the industry has a particle size in a range of about 30 μm to 40 μm. However, on occasion, phosphors having a smaller particle size are also needed to achieve the processing requirements. Although the morphologies of phosphors have been studied, there is still no effective method for controlling the particle size of phosphors.

Therefore, for the current progress of LEDs to continue, it is important to provide a red light-emitting phosphor whose particle size is controllable and is capable of increasing the color rendering index for WLEDs, and a fabricating method thereof.

BRIEF SUMMARY OF THE INVENTION

According to an embodiment, a fluoride phosphor is provided. The phosphor is represented by the following formula: $K_2[SiF_6]$:$Mn^{4+}$. The fluoride phosphor has a particle size in a range of about 1 μm to about 10 μm.

According to another embodiment, a method for fabricating a fluoride phosphor is provided. In an embodiment of the method for fabricating the fluoride phosphor, a first solution is provided. The first solution is formed by dissolving potassium fluoride (KF) and either $K_2MnF_6$ or $KMnO_4$ in a hydrofluoric acid solution. A second solution is provided. The second solution is formed by mixing a surfactant and a silane. The first solution and the second solution are mixed to form a precipitate. The precipitate is collected after the first solution and the second solution are mixed.

According to another embodiment, a light-emitting apparatus is provided. The light-emitting apparatus includes an excitation light source and a luminescent material disposed on the excitation light source. The luminescent material includes the fluoride phosphor as described above.

According to yet another embodiment, a backlight module is provided. The backlight module includes at least one of the light-emitting apparatuses described above.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

The present disclosure provides a fluoride phosphor whose particle size is controllable and is capable of increasing the color rendering index, and a fabricating method thereof. The present disclosure controls the particle size of phosphor by adding surfactants. The resulting fluoride phosphor may be used to enable blue LEDs to produce a red fluorescence. Alternatively, the resulting fluoride phosphor may be used to increase the color rendering index for WLEDs. Furthermore, the resulting fluoride phosphor may be applied to light-emitting apparatuses and backlight modules.

In one embodiment, a fluoride phosphor is provided. The fluoride phosphor is represented by the following formula: $K_2[SiF_6]:Mn^{4+}$. The fluoride phosphor may have a particle size in a range of about 1 μm to about 10 μm. For example, the fluoride phosphor may have a particle size in a range of about 1 μm to about 3 μm, about 6 μm to about 7 μm, about 8 μm to about 10 μm, or about 6 μm to about 10 μm. In one embodiment, the formula of the fluoride phosphor may be $K_2[SiF_6]:Mn^{4+}$. In one embodiment, the fluoride phosphor may emit a red light having a peak wavelength in a range of about 600 nm to about 650 nm after being excited by a light having a peak wavelength in a range of about 300 nm to about 470 nm.

It should be noted that the excitation light, which excites the red light-emitting phosphor provided in the present disclosure, has a peak wavelength which does not overlap with the peak wavelength of yellow light (from about 570 nm to about 590 nm). Accordingly, in a light-emitting apparatus containing an LED, for example, the possibility is low that the yellow light-emitting phosphor-generated yellow light, which is excited by the LED (such as a blue LED), will be absorbed by the red light-emitting phosphor provided in the present disclosure. Therefore, the color rendering index of the light-emitting apparatus may be increased by avoiding the loss of yellow light and by the red light generated by the red light-emitting phosphor provided in the present disclosure. In addition, it should also be noted that the excitation light, which excites the red light-emitting phosphor provided in the present disclosure, has a peak wavelength which does not overlap with the peak wavelength of green light (from about 495 nm to about 570 nm). Accordingly, in a light-emitting apparatus containing an LED, for example, the possibility is low that the green light-emitting phosphor-generated green light, which is excited by the LED (such as a blue LED), will be absorbed by the red light-emitting phosphor provided in the present disclosure. Therefore, the color rendering index of the light-emitting apparatus may be increased by avoiding the loss of green light and by the red light generated by the red light-emitting phosphor provided in the present disclosure. Therefore, any light having a peak wavelength in the range of about 300 nm to about 470 nm may be used as the excitation light of the phosphor provided in the present disclosure.

Figure 1:
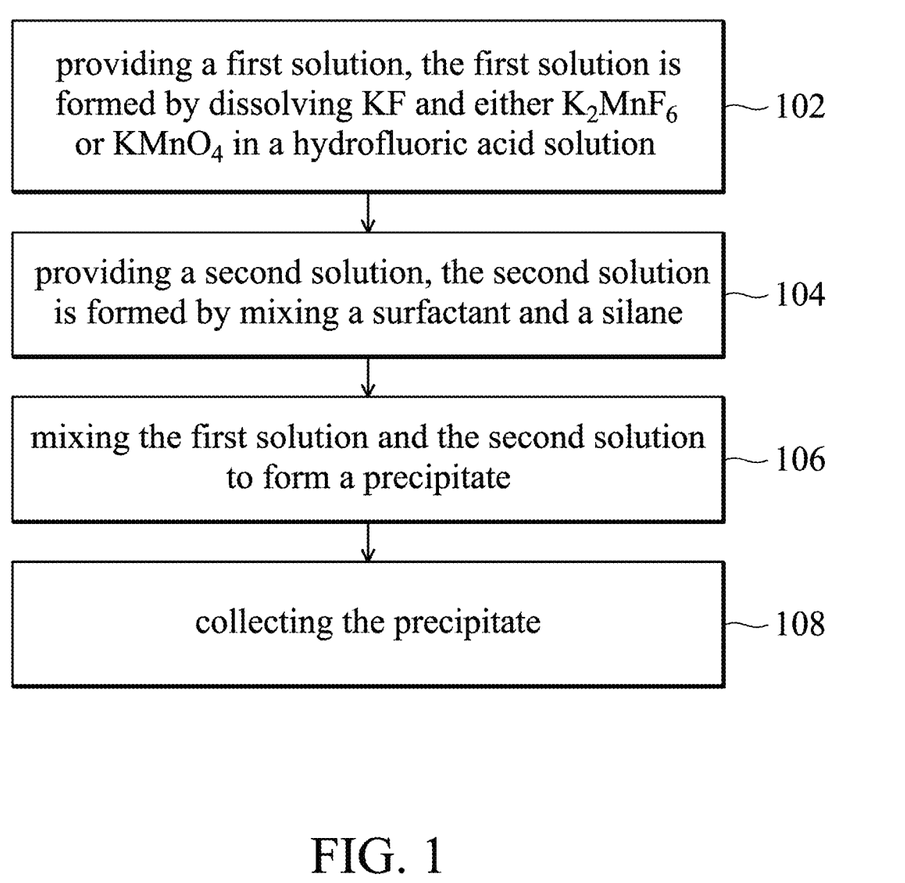
FIG. 1 is a flow diagram illustrating a method for fabricating a fluoride phosphor in accordance with some embodiments of the present disclosure.

In another embodiment, a method for fabricating the above fluoride phosphor is also provided. FIG. 1 is a flow diagram illustrating a method 100 for fabricating a fluoride phosphor in accordance with some embodiments of the present disclosure.

Firstly, the method 100 proceeds to step 102 by providing a first solution. The first solution is formed by dissolving potassium fluoride (KF) and either $K_2MnF_6$ or $KMnO_4$ in a hydrofluoric acid solution. In step 102, the molarity of potassium fluoride (KF) in the first solution may be in a range of about 0.5 mol/L to about 2.7 mol/L. For example, the molarity of potassium fluoride (KF) may be 0.666 mol/L, 1.8 mol/L, or 2.7 mol/L. It should be noted that if the molarity of potassium fluoride (KF) in the first solution is too high, there would be potassium fluoride (KF) remained after the reaction finished. In such cases, the internal quantum efficiency will be reduced because the resulting phosphor contains a mixed phase of potassium fluoride (KF). In contrast, if the molarity of potassium fluoride (KF) in the first solution is too low, the crystalline product may not be formed completely. In addition, in step 102, $K_2MnF_6$ or $KMnO_4$ serves as the source of luminescence center Mn of the resulting phosphor.

Next, the method 100 proceeds to step 104 by providing a second solution. The second solution is formed by mixing a surfactant and a silane. The surfactant used in step 104 may include an anionic surfactant such as sodium dodecyl sulfate (SDS; $NaC_{12}H_{25}SO_4$). The mole percent of the surfactant and the theoretical product may be in a range of about 5 mol % to about 10 mol %. For example, the mole percent of the surfactant and the theoretical product may be 5 mol % or 10 mol %.

It should be noted that the present disclosure controls the morphology (for example, the crystalline orientation) of phosphor by adding the above surfactants. It was found that when the mole percent of the surfactant and the theoretical product is in a range of about 5 mol % to about 10 mol %, the crystal of fluoride phosphor can be formed successfully and the particle size of the crystal is in a range of about 6 μm to about 10 μm. Also, by adjusting the amount of the surfactant, fluoride phosphors with specific particle sizes can be further obtained. In one embodiment, when the mole percent of the surfactant and the theoretical product is 10 mol %, the particle size of the fluoride phosphor is in a range of about 8 μm to 10 μm. In another embodiment, when the mole percent of the surfactant and the theoretical product is 5 mol %, the particle size of the fluoride phosphor is in a range of about 6 μm to 7 μm. However, when the amount of surfactants is too much, the doping efficiency of the activator would be reduced. In such cases, it is easy to form a crystal of $K_2SiF_6$, instead of the product $K_2[SiF_6]:Mn^{4+}$. The activator may be $K_2MnF_6$ or $KMnO_4$.

In addition, the solvent used in step 104 may include isopropanol. The mole percent of isopropanol and the theoretical product may be in a range of about 500 mol % to about 1000 mol %. It is beneficial to form fluoride phosphors having smaller particle size by using both of isopropanol and surfactants. In one embodiment, when the mole percent of surfactants and the theoretical product is 5 mol % and the mole percent of isopropanol and the theoretical product is 0.666 mol %, the particle size of the fluoride phosphor is in a range of about 1 μm to about 3 μm. Because the particle size of the resulting phosphor is controlled within a micrometer-scale, no aggregate is produced.

The silane used in step 104 may include tetraethyl orthosilicate (TEOS) or $SiO_2$.

Next, the method 100 proceeds to step 106 by mixing the first solution and the second solution to form a precipitate. Steps 102 to 106 may be performed at room temperature. For example, the temperature may be in a range of about 20° C. to about 30° C. For example, the temperature may be 25° C. Moreover, the reaction time for steps 102 to 106 may be in a range of about 10 minutes to about 30 minutes. For example, the reaction time for steps 102 to 106 may be 10 minutes, 20 minutes, or 30 minutes. So far, general processes used to fabricate nanoparticles need to be performed at high temperature (such as 200° C.) and high pressure. In contrast, the method for fabricating the fluoride phosphor provided in the present disclosure can be performed at normal temperature and pressure. Also, the reaction can be finished in a short reaction time such as 10 minutes.

Finally, the method 100 proceeds to step 108 by collecting the precipitate formed in step 106. The collected precipitate is the $K_2[SiF_6]:Mn^{4+}$ fluoride phosphor described in the present disclosure. The method for collecting the precipitate may include well-known techniques such as washing, filtration, and dry. In one embodiment, the fluoride phosphor may be dried at a temperature in a range of about 40° C. to about 80° C. For example, the temperature may be 50° C. or 60° C.

In another embodiment, a light-emitting apparatus is provided. The light-emitting apparatus includes an excitation light source and a luminescent material disposed on the excitation light source. The excitation light source may include a light-emitting diode (LED) having an emission wavelength in a range of about 320 nm to about 500 nm. For example, the excitation light source may be a blue LED. The emission wavelength of the blue LED is in a range of about 400 nm to about 500 nm, preferably from about 440 nm to about 480 nm.

In one embodiment, the luminescent material may include a fluoride phosphor represented by the following formula: $K_2[SiF_6]:Mn^{4+}$. The fluoride phosphor may have a particle size in a range of about 1 μm to about 10 μm. For example, the fluoride phosphor may have a particle size in a range of about 1 μm to about 3 μm, about 6 μm to about 7 μm, about 8 μm to about 10 μm, or about 6 μm to about 10 μm. In one embodiment, the fluoride phosphor may emit a red light having a peak wavelength in a range of about 600 nm to about 650 nm after being excited by a light having a peak wavelength in a range of about 300 nm to about 470 nm.

In one embodiment, the $K_2[SiF_6]:Mn^{4+}$ fluoride phosphor of the present disclosure may be blended with other phosphors. For example, it may be blended with a yellow light-emitting phosphor (such as a YAG yellow light-emitting phosphor or a silicate yellow light-emitting phosphor) and/or a green light-emitting phosphor (such as a β-SiAlON green light-emitting phosphor, a YAG green light-emitting phosphor, a silicate green light-emitting phosphor, or a nitride green light-emitting phosphor). The yellow light-emitting phosphor and/or the green light-emitting phosphor may be blended with the red light-emitting phosphor provided in the present disclosure to emit white light after being excited by blue light. In the blended phosphor, the ratio of the yellow light-emitting phosphor, the green light-emitting phosphor, and the red light-emitting phosphor is not limited. The ratio of any two of the blended phosphor may be in a range of 1:99 to 99:1. For example, the ratio of the yellow light-emitting phosphor, the green light-emitting phosphor, and the red light-emitting phosphor may be 1:1:1. The above ratio may be adjusted according to the actual need and the desired properties of the phosphor. The wavelength of the blue light which serves as the excitation light may be in a range of about 400 nm to about 500 nm, preferably from about 440 nm to about 480 nm. It should be noted that the excitation light, which excites the red light-emitting phosphor provided in the present disclosure, has a peak wavelength which does not overlap with the peak wavelength of yellow light (from about 570 nm to about 590 nm) and the peak wavelength of green light (from about 495 nm to about 570 nm). Accordingly, in a light-emitting apparatus such as an LED (for example, a blue LED) containing yellow light-emitting and/or green light-emitting luminescent materials, the color rendering index of the light-emitting apparatus may be increased by avoiding the loss of yellow light and/or green light and by the red light generated by the red light-emitting phosphor provided in the present disclosure.

Figure 2:
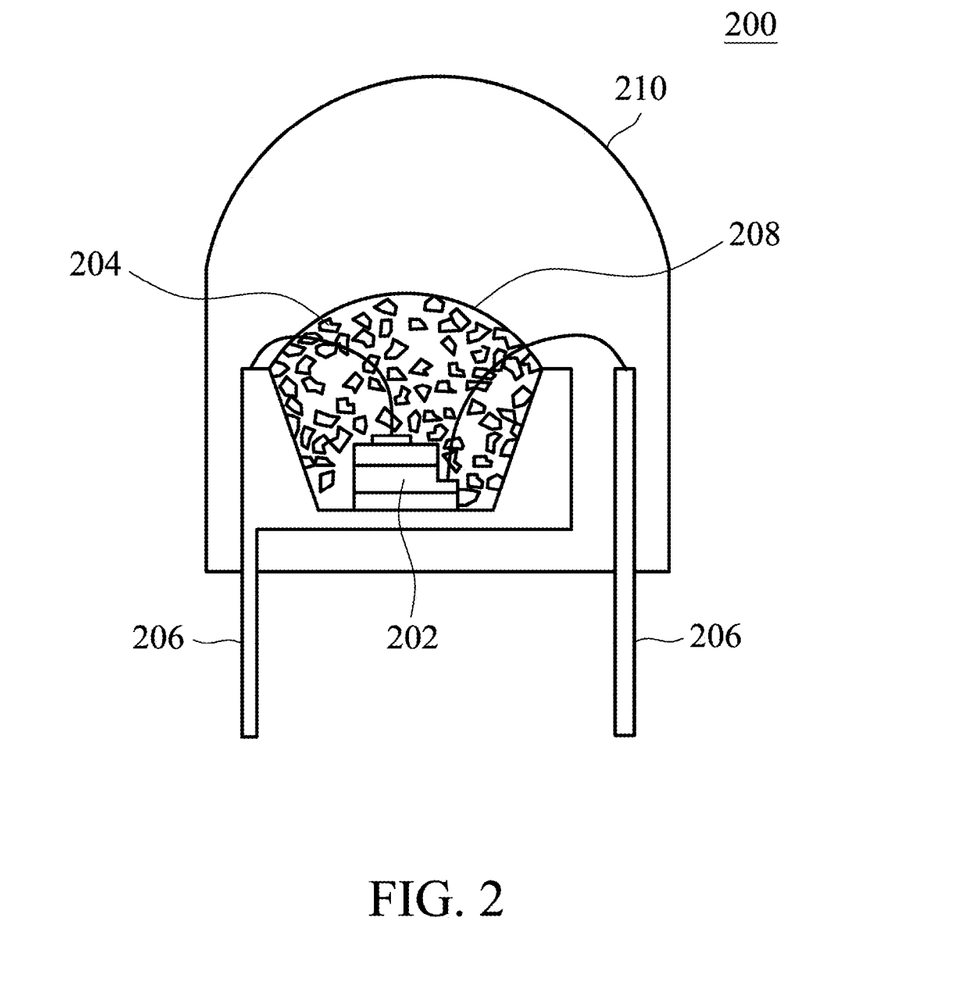
FIG. 2 illustrates a cross-sectional view of light-emitting apparatus in accordance with an embodiment of the present disclosure.

FIG. 2 illustrates a cross-sectional view of a light-emitting apparatus 200 in accordance with an embodiment of the present disclosure. The light-emitting apparatus 100 includes an excitation light source 202 and a luminescent material 204 disposed on the excitation light source 202. In this embodiment, the excitation light source 202 is a blue LED disposed on a lead frame 206. The excitation light source 202 is covered by a transparent resin 208 mixed with the luminescent material 204. A packaging material 210 is used to package the excitation light source 202, the lead frame 206, and the transparent resin 208. It should be realized that the above arrangement and schematic of the lighting apparatus is merely one of the examples of the present disclosure. The present disclosure is not limited thereto. It will be apparent to those skilled in the art that various modifications and variations can be made to the disclosed embodiments.

In yet another embodiment, a backlight module is provided. The backlight module includes at least one of the aforementioned light-emitting apparatuses. The detailed description of the light-emitting apparatus is similar to the content described above, and hence is not described again to avoid unnecessary repetition. The backlight module may be applied to displays (such as liquid-crystal displays) and may serve as a direct-light type backlight module or a side-edge backlight module for displays. In the aforementioned backlight module, the fluoride phosphor may be further blended with other phosphors. The description of the other phosphors may refer to the description in related paragraphs, and hence is not described again to avoid unnecessary repetition.

The Preparation Examples and Examples are described below to illustrate the method for fabricating the fluoride phosphor, and the morphologies and properties of the phosphor.

Examples 1-3: Fabricating $K_2[SiF_6]:Mn^{4+}$ Phosphors Under Different Conditions Example 1

0.35 g of potassium fluoride (KF) and 0.11 g of $K_2MnF_6$ were dissolved in 9.5 mL, 40 wt % of hydrofluoric acid (HF) aqueous solution at 25° C. and stirred for 15 minutes to form a first solution. On the other hand, 0.2 g of sodium dodecyl sulfate (SDS; $NaC_{12}H_{25}SO_4$) was dissolved in 2 mL of tetraethyl orthosilicate (TEOS) at room temperature and stirred for 30 minutes to form a second solution. Then, the first solution and the second solution were mixed at 25° C. and stirred for 15 minutes to produce a precipitate. Afterwards, after being washed twice by 30 mL of ethanol and washed once by 30 mL of acetone, the pricipitation was oven-dried at 60° C. for 2 hours. Then, the $K_2[SiF_6]:Mn^{4+}$ fluoride phosphor was obtained.

Figure 3A:
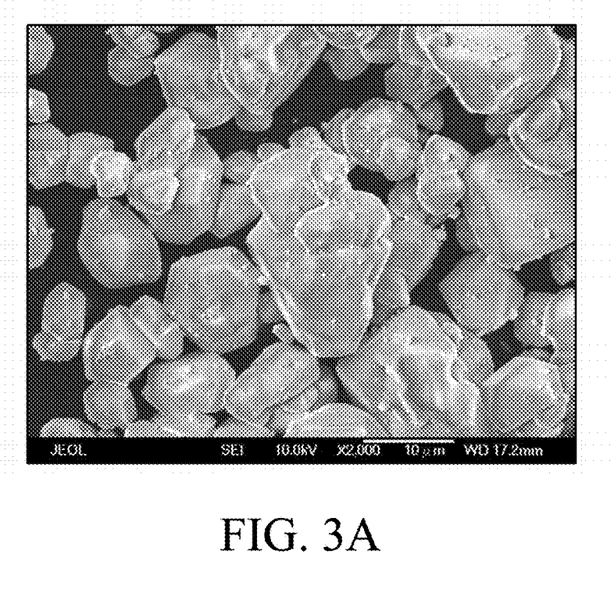
FIGS. 3A-3D illustrate the surface morphologies of $K_2[SiF_6]$:$Mn^{4+}$ phosphors obtained by adding different concentrations of surfactants in accordance with some embodiments of the present disclosure.
Figure 3B:
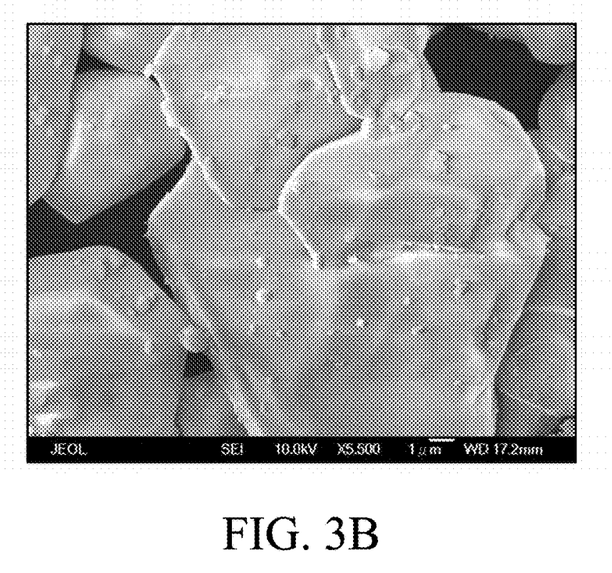

The surface morphology of the $K_2[SiF_6]:Mn^{4+}$ fluoride phosphor of Example 1 was observed. The results are shown in FIGS. 3A and 3B. The magnification shown in FIG. 3A is 2000 times. The magnification shown in FIG. 3B is 5500 times. It can be observed from FIGS. 3A and 3B that the particle size of the $K_2[SiF_6]:Mn^{4+}$ fluoride phosphor of Example 1 is from 8 μm to 10 μm.

Example 2

0.35 g of potassium fluoride (KF) and 0.11 g of $K_2MnF_6$ were dissolved in 9.5 mL, 40 wt % of hydrofluoric acid (HF) aqueous solution at 25° C. and stirred for 15 minutes to form a first solution. On the other hand, 0.1 g of sodium dodecyl sulfate (SDS; $NaC_{12}H_{25}SO_4$) was dissolved in 2 mL of tetraethyl orthosilicate (TEOS) at room temperature and stirred for 30 minutes to form a second solution. Then, the first solution and the second solution were mixed at 25° C. and stirred for 15 minutes to produce a pricipitation. Afterwards, after being washed twice by 30 mL of ethanol and washed once by 30 mL of acetone, the pricipitation was oven-dried at 60° C. for 2 hours. Then, the $K_2[SiF_6]:Mn^{4+}$ fluoride phosphor was obtained.

Figure 3C:
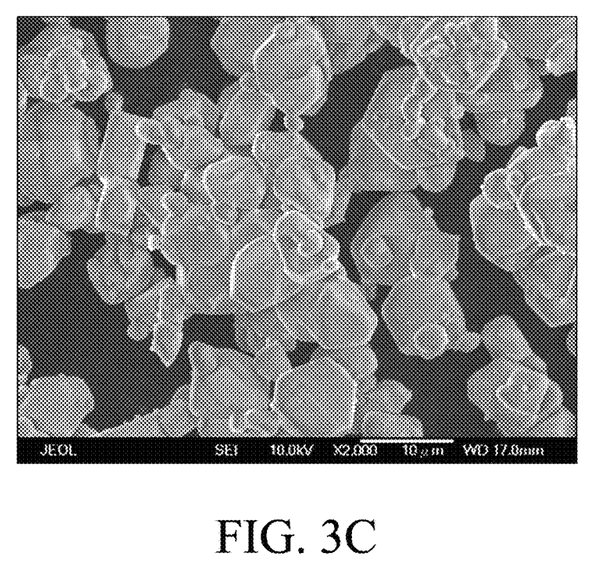
Figure 3D:
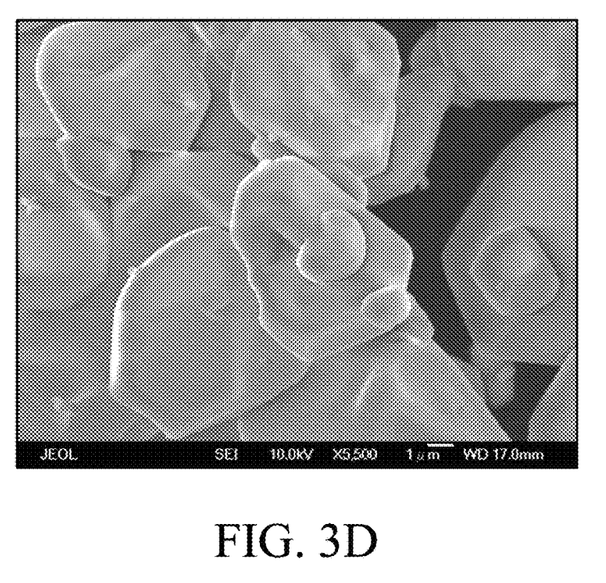

The surface morphology of the $K_2[SiF_6]:Mn^{4+}$ fluoride phosphor of Example 2 was observed. The results are shown in FIGS. 3C and 3D. The magnification shown in FIG. 3C is 2000 times. The magnification shown in FIG. 3D is 5500 times. It can be observed from FIGS. 3C and 3D that the particle size of the $K_2[SiF_6]:Mn^{4+}$ fluoride phosphor of Example 2 is from 6 μm to 7 μm.

Example 3

0.35 g of potassium fluoride (KF) and 0.11 g of $K_2MnF_6$ were dissolved in 9.5 mL, 40 wt % of hydrofluoric acid (HF) aqueous solution at 25° C. and stirred for 15 minutes to form a first solution. On the other hand, 0.1 g of sodium dodecyl sulfate (SDS; $NaC_{12}H_{25}SO_4$) was dissolved in 2 mL of tetraethyl orthosilicate (TEOS) and 4.5 mL of isopropanol ($C_3H_8O$) at room temperature and stirred for 30 minutes to form a second solution. Then, the first solution and the second solution were mixed at 25° C. and stirred for 15 minutes to produce a pricipitation. Afterwards, after being washed twice by 30 mL of ethanol and washed once by 30 mL of acetone, the pricipitation was oven-dried at 60° C. for 2 hours. Then, the $K_2[SiF_6]:Mn^{4+}$ fluoride phosphor was obtained.

Figure 3E:
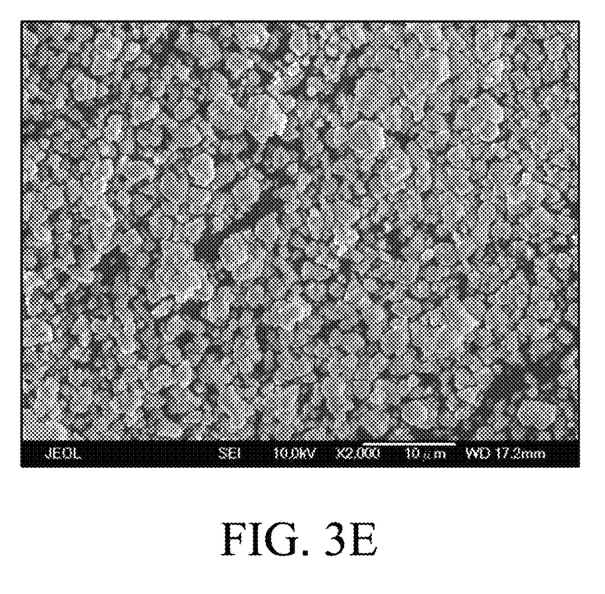
FIGS. 3E-3F illustrate the surface morphologies of $K_2[SiF_6]$:$Mn^{4+}$ phosphors obtained by adding surfactants and isopropanol in accordance with some embodiments of the present disclosure.
Figure 3F:
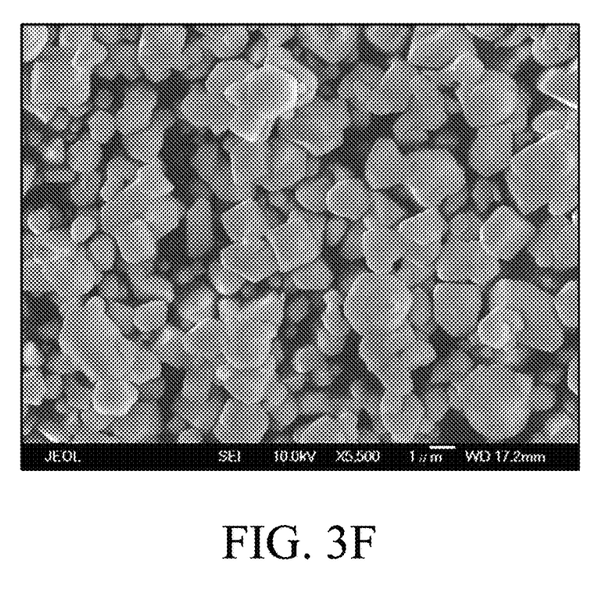

The surface morphology of the $K_2[SiF_6]:Mn^{4+}$ fluoride phosphor of Example 3 was observed. The results are shown in FIGS. 3E and 3F. The magnification shown in FIG. 3E is 2000 times. The magnification shown in FIG. 3F is 5500 times. It can be observed from FIGS. 3E and 3F that the particle size of the $K_2[SiF_6]:Mn^{4+}$ fluoride phosphor of Example 3 is from 1 μm to 3 μm.

The mole percent of sodium dodecyl sulfate (SDS) added in Examples 1-3 and the theoretical product thereof, the mole percent of isopropanol ($C_3H_8O$) and the theoretical product, and the particle sizes of the resulting $K_2[SiF_6]:Mn^{4+}$ fluoride phosphor are shown in Table 1.

TABLE 1

| Sample | SDS (mol %) | $C_3H_8O$ (mol %) | Particle size (μm) |
| --- | --- | --- | --- |
| Example 1 | 10 | 0 | 8-10 |
| Example 2 | 5 | 0 | 6-7 |
| Example 3 | 5 | 839 | 1-3 |

As shown in Table 1, the amount of sodium dodecyl sulfate (SDS) is substantially in a positive relationship with the particle size of the $K_2[SiF_6]:Mn^{4+}$ fluoride phosphor. The resulting $K_2[SiF_6]:Mn^{4+}$ fluoride phosphor may have a smaller particle size when isopropanol ($C_3H_8O$) and sodium dodecyl sulfate (SDS) are both added than that when only sodium dodecyl sulfate (SDS) is added.

X-Ray Diffraction (XRD) Patterns

The X-ray diffraction (XRD) patterns of $K_2[SiF_6]:Mn^{4+}$ fluoride phosphors of Examples 1-3 were recorded with an X-ray powder diffractometer. The results are shown in FIG. 4.

Figure 4:
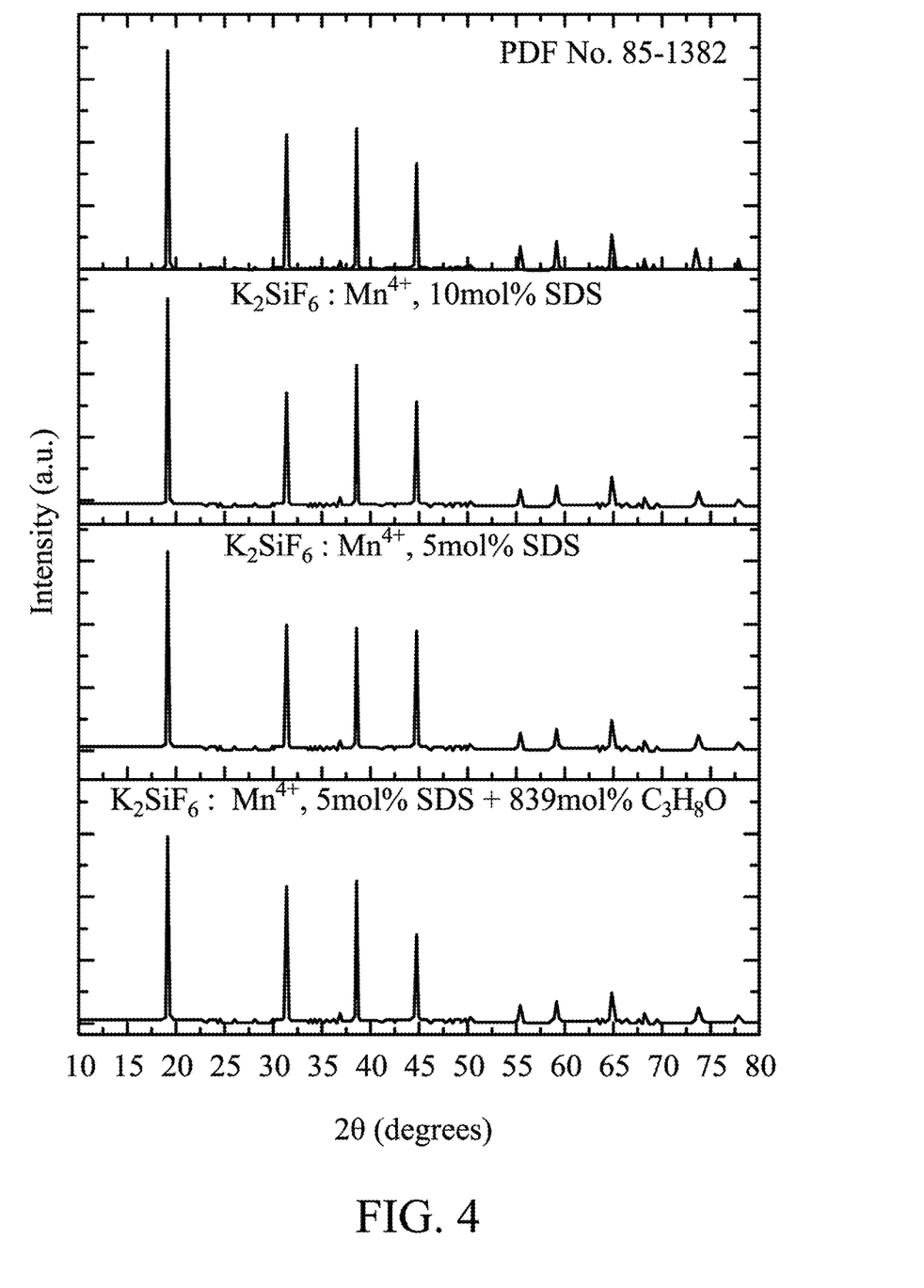
FIG. 4 illustrates X-ray diffraction (XRD) patterns of $K_2[SiF_6]$:$Mn^{4+}$ phosphors obtained under different conditions in accordance with some embodiments of the present disclosure.

The top row of FIG. 4 shows the standard pattern of $K_2[SiF_6]:Mn^{4+}$ from the Joint Committee on Powder Diffraction Standards (JCPDS No. 85-1382). It can be observed from FIG. 4 that the X-ray diffraction (XRD) patterns of fluoride phosphors formed in Example 1-3 were similar to the standard pattern. Therefore, $K_2[SiF_6]:Mn^{4+}$ fluoride phosphors were successfully formed in Examples 1-3.

Figure 5A:
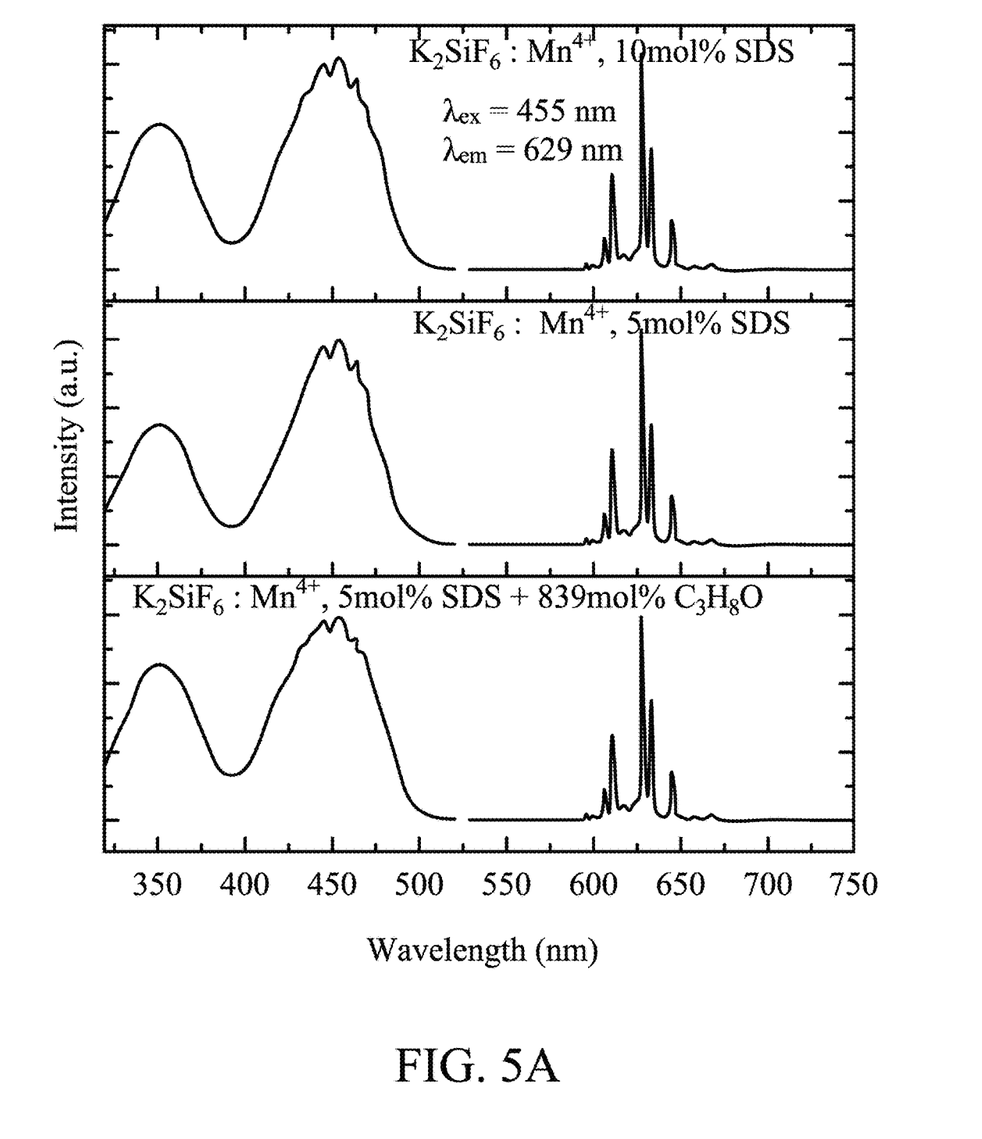
FIG. 5A illustrates PLE patterns and PE patterns of $K_2[SiF_6]:Mn^{4+}$ phosphors obtained under different conditions in accordance with some embodiments of the present disclosure.

FIG. 5A illustrates PLE patterns and PE patterns of $K_2[SiF_6]:Mn^{4+}$ fluoride phosphors obtained under different conditions. It can be observed from FIG. 5A that the emission light of $K_2[SiF_6]:Mn^{4+}$ fluoride phosphors of Examples 1-3 show a peak at 600 nm to 650 nm.

Figure 5B:
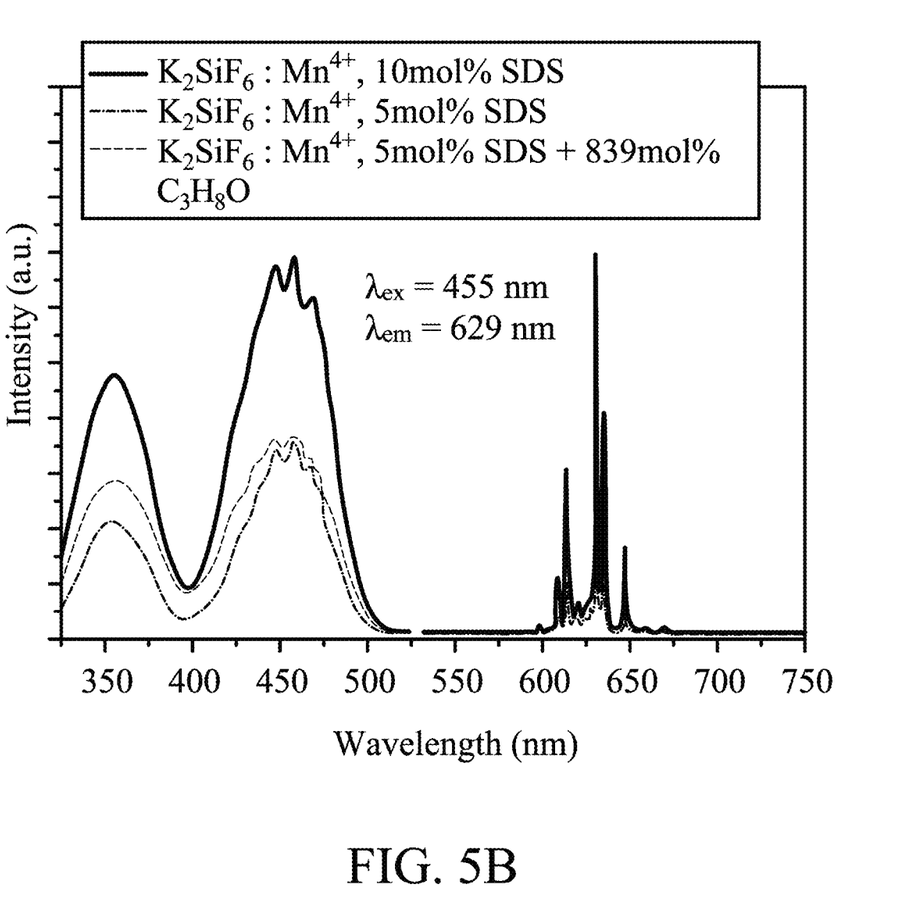
FIG. 5B illustrates the overlay of PLE patterns and PE patterns of $K_2[SiF_6]:Mn^{4+}$ phosphors obtained under different conditions in accordance with some embodiments of the present disclosure.

FIG. 5B illustrates the overlay of PLE patterns and PE patterns of $K_2[SiF_6]:Mn^{4+}$ fluoride phosphors obtained under different conditions. It can be observed from FIG. 5B that the $K_2[SiF_6]:Mn^{4+}$ fluoride phosphor of Example 1 has the highest luminous intensity, while the $K_2[SiF_6]:Mn^{4+}$ fluoride phosphors of Examples 2 and 3 have similar luminous intensities. Therefore, although the luminous intensity is substantially in a positive relationship with the particle size of the fluoride phosphor, the luminous intensity of fluoride phosphor having a smaller particle size may be maintained in a certain extent by adding isopropanol during the fabrication. The fluoride phosphor having a smaller particle size (about 1 μm to about 3 μm), which is formed by adding isopropanol, has a luminous intensity similar to that of the fluoride phosphor having a particle size in a range of about 6 μm to about 7 μm.

From the above, a fluoride phosphor whose particle size is controllable and is capable of increasing the color rendering index and a fabricating method thereof are provided. The present disclosure synthesizes a fluoride phosphor having a small particle size in a range of about 6 μm to about 10 μm by adding an appropriate amount of sodium dodecyl sulfate (SDS). Alternatively, the present disclosure synthesizes a fluoride phosphor having a small particle size in a range of about 1 μm to about 3 μm by adding both of an appropriate amount of sodium dodecyl sulfate (SDS) and isopropanol. In addition, the method for fabricating a fluoride phosphor provided in the present disclosure may be performed at room temperature and may be finished in a short reaction time. The resulting fluoride phosphor may be used to enable blue LEDs to produce a red fluorescence. Also, the resulting fluoride phosphor may be applied to a blue LED chip accompanied by YAG yellow light-emitting phosphor ($Y_3Al_5O_{12}$:Ce; Yttrium aluminum garnet) and/or green light-emitting phosphor to produce white light and increase the color rendering index.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a fluoride phosphor, comprising:
   (a) providing a first solution, wherein the first solution is formed by dissolving potassium fluoride (KF) and either $K_2MnF_6$ or $KMnO_4$ in a hydrofluoric acid solution;
   (b) providing a second solution, wherein the second solution is formed by mixing a surfactant and a silane, and wherein the surfactant comprises sodium dodecyl sulfate (SDS; $NaC_{12}H_{25}SO_4$);
   (c) mixing the first solution and the second solution to form a precipitate; and
   (d) collecting the precipitate after step (c).

2. The method for fabricating the fluoride phosphor as claimed in claim 1, wherein the reaction time from step (a) to step (c) is in a range of about 10 minutes to about 30 minutes.

3. The method for fabricating the fluoride phosphor as claimed in claim 1, wherein the molarity of potassium fluoride (KF) in the first solution is in a range of about 0.5 mol/L to about 2.7 mol/L.

4. The method for fabricating the fluoride phosphor as claimed in claim 1, wherein the silane comprises tetraethyl orthosilicate (TEOS).

5. The method for fabricating the fluoride phosphor as claimed in claim 1, wherein the mole percent of the surfactant and the precipitate is in a range of about 5 mol % to about 10 mol %.

6. The method for fabricating the fluoride phosphor as claimed in claim 5, wherein the fluoride phosphor has a particle size in a range of about 6 μm to about 10 μm.

7. The method for fabricating the fluoride phosphor as claimed in claim 1, wherein the second solution further comprises isopropanol.

8. The method for fabricating the fluoride phosphor as claimed in claim 7, wherein the mole percent of isopropanol and the precipitate is in a range of about 500 mol % to about 1000 mol %.

9. The method for fabricating the fluoride phosphor as claimed in claim 8, wherein the particle size of the fluoride phosphor is in a range of about 1 μm to about 3 μm.

10. The method for fabricating the fluoride phosphor as claimed in claim 1, wherein the fluoride phosphor emits a red light having a peak wavelength in a range of about 600 nm to about 650 nm after being excited by a light having a peak wavelength in a range of about 300 nm to about 470 nm.

11. A fluoride phosphor fabricated by the method as claimed in claim 1 represented by the following formula:

$$K_2[SiF_6]:Mn^{4+},$$

wherein the fluoride phosphor has a particle size in a range of about 1 μm to about 10 μm.

12. The fluoride phosphor as claimed in claim 11, wherein the fluoride phosphor has a particle size in a range of about 6 μm to about 10 μm.

13. The fluoride phosphor as claimed in claim 11, wherein the fluoride phosphor has a particle size in a range of about 1 μm to about 3 μm.

14. The fluoride phosphor as claimed in claim 11, wherein the fluoride phosphor emits a red light having a peak wavelength in a range of about 600 nm to about 650 nm after being excited by a light having a peak wavelength in a range of about 300 nm to about 470 nm.

15. A light-emitting apparatus, comprising:
    an excitation light source;
    a luminescent material disposed on the excitation light source, wherein the luminescent material comprises the fluoride phosphor as claimed in claim 11.

16. The light-emitting apparatus as claimed in claim 15, wherein the excitation light source comprises a light-emitting diode having an emission wavelength in a range of about 320 nm to about 500 nm.

17. The light-emitting apparatus as claimed in claim 15, wherein the luminescent material further comprises a yellow light-emitting phosphor and/or a green light-emitting phosphor.

18. The light-emitting apparatus as claimed in claim 15, wherein the lighting apparatus produces white light.

19. A backlight module, comprising at least one of the lighting apparatuses as claimed in claim 15.

20. A method for fabricating a fluoride phosphor, comprising:
    (a) providing a first solution, wherein the first solution is formed by dissolving potassium fluoride (KF) and either $K_2MnF_6$ or $KMnO_4$ in a hydrofluoric acid solution;
    (b) providing a second solution, wherein the second solution is formed by mixing a surfactant and a silane, and wherein the second solution further comprises isopropanol;
    (c) mixing the first solution and the second solution to form a precipitate, wherein the mole percent of isopropanol and the precipitate is in a range of about 500 mol % to about 1000 mol %; and
    (d) collecting the precipitate after step (c).

* * * * *